United States Patent
Kuan et al.

(10) Patent No.: US 9,450,117 B2
(45) Date of Patent: Sep. 20, 2016

(54) OPTOELECTRONIC DEVICE HAVING SURFACE PERIODIC GRATING STRUCTURE

(71) Applicant: Kingwave Corporation, Taipei (TW)

(72) Inventors: Chieh-Hsiung Kuan, Taipei (TW); Ming-Lun Lee, Taipei (TW)

(73) Assignee: Kingwave Corporation, Taipei (TW)

( * ) Notice: Subject to any disclaimer, the term of this patent is extended or adjusted under 35 U.S.C. 154(b) by 0 days.

(21) Appl. No.: 14/536,930

(22) Filed: Nov. 10, 2014

(65) Prior Publication Data
US 2015/0129023 A1    May 14, 2015

(30) Foreign Application Priority Data
Nov. 11, 2013   (TW) ................. 102140898

(51) Int. Cl.
| | |
|---|---|
| *H01L 31/0232* | (2014.01) |
| *H01L 31/0352* | (2006.01) |
| *H01L 31/105* | (2006.01) |
| *H01L 31/18* | (2006.01) |

(52) U.S. Cl.
CPC . *H01L 31/02327* (2013.01); *H01L 31/035236* (2013.01); *H01L 31/105* (2013.01); *H01L 31/1844* (2013.01); *Y02E 10/52* (2013.01); *Y02E 10/544* (2013.01)

(58) Field of Classification Search
None
See application file for complete search history.

(56) References Cited

U.S. PATENT DOCUMENTS

| | | | | |
|---|---|---|---|---|
| 2001/0028055 A1* | 10/2001 | Fafard | .................... | B82Y 10/00 257/17 |
| 2009/0189058 A1* | 7/2009 | Mitsui | .................... | B82Y 10/00 250/208.1 |
| 2010/0289061 A1* | 11/2010 | Matsukura | ............. | B82Y 20/00 257/189 |
| 2012/0248412 A1* | 10/2012 | Mitin | .................... | B82Y 10/00 257/21 |

FOREIGN PATENT DOCUMENTS

| | | |
|---|---|---|
| TW | 200847450 A | 12/2008 |
| TW | 201007815 A | 2/2010 |
| TW | 201230376 A | 7/2012 |

OTHER PUBLICATIONS

Lee, Ming-Lun et al., Performance enhancement in Quantum Well Infrared Photodetector utilizing the Grating Structure, Jun. 10, 2013, CLEO:2013 Technical Digest OSA 2013 with Agenda, three pages.

\* cited by examiner

*Primary Examiner* — Bilkis Jahan
(74) *Attorney, Agent, or Firm* — C. G. Mersereau; Nikolai & Mersereau, P.A.

(57) ABSTRACT

The present invention provides a optoelectronic device having a surface periodic grating structure and a manufacturing method thereof, which includes: a substrate; a multi-layer semiconductor structure layer formed on the substrate; and a periodic grating structure layer embedded in the multi-layer semiconductor structure layer by etching based on optimized parameters. A direction of an incident light to the optoelectronic device is changed to be resonant to the multi-layer semiconductor structure layer to enhance opto-electricity of the optoelectronic device. The method includes: (1) providing a substrate; (2) forming a multi-layer semiconductor structure layer on the substrate; (3) selecting parameters to perform a design for a periodic grating structure layer on a surface of the multi-layer semiconductor structure layer; and (4) forming the periodic grating structure layer embedded in the multi-layer semiconductor structure layer by etching.

17 Claims, 9 Drawing Sheets

OPTOELECTRONIC DEVICE HAVING SURFACE PERIODIC GRATING STRUCTURE

FIELD OF THE INVENTION

The present invention relates to an optoelectronic device and the manufacturing method thereof, and particularly to an optoelectronic device having a surface periodic grating structure and the manufacturing method thereof.

BACKGROUND OF THE INVENTION

With the rapid technology development nowadays, optoelectronic elements have become widely used in our daily lives. In recent years, research to the optoelectronic elements has focused on enhancing the efficiency of the optoelectronic elements. Typically, optoelectronic elements may include photodetectors and solar cells. Implementations of the photodetectors include visible light detectors, which are photodetectors that can be utilized in the digital cameras, and optical pickup heads of digital optical drives. Generally, the surface of a visible light detector may be applied with surface plasma effect to strengthen the incident light such that efficiency may be enhanced. For example, Taiwan Patent No. 1335084, entitled "FULL COLOR MULTI-PIXEL PHOTODETECTOR DEVICE" utilizes the surface plasma effect, which responds only in certain wavebands and bandwidths, to enhance the detectability of photodetectors by detecting incident light in the certain wavebands. Moreover, a photodetector may include an infrared detector, which is applicable in military and general purpose uses. For example, a quantum well infrared detector does not absorb normal incident light, and requires additional optical guidance mechanism to transform a normal incident light in the TE mode, which is perpendicular to the horizontal surface, to the incident light in the TM mode, which is parallel to the horizontal surface. Typically, the application also utilizes surface plasma effect to enhance the detectability. Lastly, the solar cell is also an important technology due to the fact that sunlight is an unlimited natural source available in the foreseeable future, and that electricity obtained by transforming the optical energy of the sunlight may be utilized in a variety of power devices. For example, Taiwan Patent Publication No. 201230376, entitled "THIN-FILM SOLAR CELL OPTICAL CONFINEMENT AND INTEGRATION METHOD AND STRUCTURE THEREOF" utilizes the high scattering efficiency and strong near field optical effect of the surface plasma nanostructure to increase the time for light to stay in the optical absorbing layer, such that the optoelectronic flow of the elements can be increased to enhance the efficiency of the solar cell. Further, Taiwan Patent Publication No. 201007815, entitled "METAL THIN FILM USED IN OPTOELECTRONIC ELEMENT AND MANUFACTURING METHOD THEREOF" utilizes a wave array to induce surface plasma resonance to enhance the transmittance of the metal thin films. The aforementioned arts utilize surface plasma resonance techniques to enhance the efficiency of the optoelectronic elements. However, surface plasma resonance techniques must be performed with the existence of both the metal layer and non-conductive dielectric layer, and a metal grating thin layer and a dielectric layer are required, which increases the complexity and time consumption of the manufacturing process. Therefore, based on the drawbacks of the known arts, there is a need to provide a new method to enhance the efficiency of the optoelectronic element without increase the complexity of the manufacturing process.

SUMMARY OF THE INVENTION

An objective of the present invention is to provide an optoelectronic device having a surface periodic grating structure, such that a direction of the incident light is changed to become a horizontal light parallel to the surface of the multi-layer semiconductor structure layer and resonant to the multi-layer semiconductor structure layer, such that a transmitting path of the incident light in the multi-layer semiconductor structure layer is extended to enhance optoelectricity of the optoelectronic device.

Another objective of the present invention is to provide a method of forming an optoelectronic device having a surface periodic grating structure, which does not require additional steps to form the metal grating thin film and dielectric layers, and may enhance the optoelectricity of the optoelectronic device by etching the multi-layer semiconductor structure layer to form a periodic grating structure layer embedded therein.

To achieve the aforementioned and other objectives, an aspect of the present invention provides an optoelectronic device having a surface periodic grating structure, which includes: a substrate; a multi-layer semiconductor structure layer formed on the substrate; and a periodic grating structure layer embedded in the multi-layer semiconductor structure layer by etching, the periodic grating structure layer being performed with a design on a surface of the multi-layer semiconductor structure layer based on parameters including an optimized period, a filling factor and a depth. The substrate, the multi-layer semiconductor structure layer and the periodic grating structure layer form the optoelectronic device. An incident light to the optoelectronic device is configured to pass through the periodic grating structure layer to enter the multi-layer semiconductor structure layer, and a direction of the incident light is changed to become a horizontal light parallel to the surface of the multi-layer semiconductor structure layer and resonant to the multi-layer semiconductor structure layer, such that a transmitting path of the incident light in the multi-layer semiconductor structure layer is extended to enhance optoelectricity of the optoelectronic device. In certain embodiments, the multi-layer semiconductor structure layer includes at least one of an infrared detector structure, a visible light detector structure, an ultraviolet light detector structure, or a solar cell structure, and a waveband frequency spectrum of the incident light is between visible light and far infrared spectrum (300 nm~24 um).

To achieve the aforementioned and other objectives, an aspect of the present invention provides a method of forming an optoelectronic device having a surface periodic grating structure, which includes: (1) providing a substrate; (2) forming a multi-layer semiconductor structure layer on the substrate; (3) selecting parameters including an optimized period, a filling factor and a depth to perform a design for a periodic grating structure layer on a surface of the multi-layer semiconductor structure layer; and (4) forming the periodic grating structure layer embedded in the multi-layer semiconductor structure layer by etching.

Comparing to the known arts, the optoelectronic device and the manufacturing method thereof includes the following advantages and characteristics: 1. The present invention does not require additional steps to form the metal grating thin film and dielectric layers, and may enhance the optoelectricity of the optoelectronic device by etching the multi-layer semiconductor structure layer to form a periodic grating structure layer embedded therein, which is different from the conventional surface plasma resonant technology, and has a simplified and fast manufacturing process. 2. The periodic grating structure of the present invention is formed in the active region or deeper region, which extends the transmitting path of the incident light in the multi-layer semiconductor structure layer, and increases the resonance of the incident light and the active region, such that the optoelectricity of the optoelectronic device is enhanced. 3. The period of the periodic grating structure of the present invention may be determined to be an optimized dimension based on the incident light with different wavelength, such that the light satisfies the resonance condition, and may be transmitted horizontally in the active region of the optoelectronic device to enhance the optoelectricity of the optoelectronic device.

DESCRIPTION OF EMBODIMENTS OF THE INVENTION

To understand the objectives, features and effects of the present invention, the following detailed description of the embodiment of the present invention is provided along with the accompanied drawings to further describe the present invention in greater detail as follows.

Figure 1:
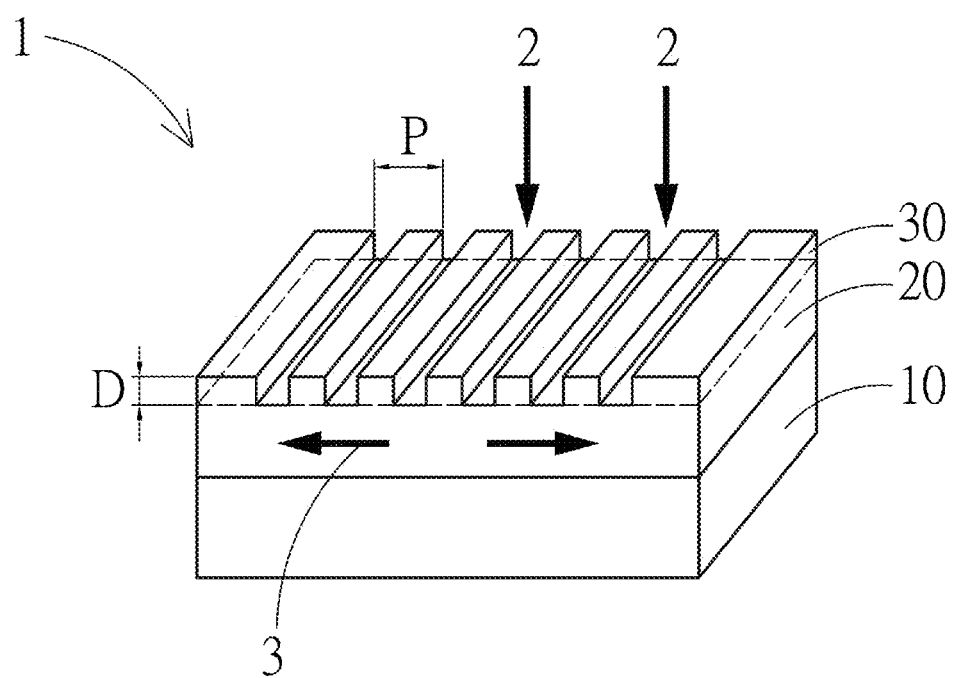
FIG. 1 is a schematic view of an optoelectronic device having a surface periodic grating structure according to an embodiment of the present invention.

Refer now to FIG. 1, which shows a schematic view of an optoelectronic device having a surface periodic grating structure according to an embodiment of the present invention. The optoelectronic device has a substrate 10, a multi-layer semiconductor structure layer 20 and a periodic grating structure layer 30. The substrate 10, the multi-layer semiconductor structure layer 20 and the periodic grating structure layer 30 form the optoelectronic apparatus 1. An incident light 2 to the optoelectronic apparatus 1 is configured to pass through the periodic grating structure layer 30 to perform diffraction and transmittance, and to enter the multi-layer semiconductor structure layer 20. When the wavelength of the incident light 2 is close to the period of the periodic grating structure layer 30, i.e., satisfying the dispersion equation, the abnormal transmittance is obtained and the resonance condition is satisfied. Thus, a direction of the incident light 2 is changed to become a horizontal light 3 parallel to the surface of the multi-layer semiconductor structure layer 20 and resonant to the multi-layer semiconductor structure layer 20, such that a transmitting path of the incident light 2 in the multi-layer semiconductor structure layer 20 is effectively extended without dispersion to the air, and the optoelectricity of the optoelectronic device 1 is enhanced. A waveband frequency spectrum of the incident light 2 is between visible light and far infrared spectrum (300 nm~24 um).

The substrate 10 may be selected from one of Si, silicon on insulator (SOI), Ge, germanium on insulator (GeOI), GaAs, InP, InSb, CdTe, SiC, $Al_2O_3$, AlN, GaN, glass, quartz and a metal.

The multi-layer semiconductor structure layer 20 may be selected from one of a group IV element semiconductor and alloy thereof, a group III-V compound and alloy thereof, a group II-VI compound and alloy thereof, and group IV-VI compound and alloy thereof. In certain embodiments, the multi-layer semiconductor structure layer 20 may include an infrared detector structure, and the infrared detector structure may be a quantum well infrared detector, a superlattice infrared detector, or a combination of the quantum well infrared detector and the superlattice infrared detector. In certain embodiments, the multi-layer semiconductor structure layer 20 may include at least one of a visible light detector structure or a ultraviolet light detector structure, and the visible light detector structure or the ultraviolet light detector structure may include at least one of a p-n junction or a p-i-n junction. In certain embodiments, the multi-layer semiconductor structure layer 20 may include a solar cell structure. It should be appreciated that a method of forming the multi-layer semiconductor structure layer 20 on the substrate 10 may be one of molecular beam epitoxy (MBE) technology, metal-organic chemical vapor deposition (MOCVD) technology, and liquid phase epitoxy (LPE) technology.

In certain embodiments, the periodic grating structure layer 30 may be one of a periodic column grating structure, a periodic gap grating structure, or a periodic column and gap grating structure and arranged in one-dimension, two-dimension or three-dimension, and may be performed with a design on the surface of the multi-layer semiconductor structure layer 20 based on parameters including an optimized period P, a filling factor and a depth D by one of e-beam lithography technology or photolithography technology and embedded in the multi-layer semiconductor structure layer 20 by dry etching or wet etching. In certain embodiments, the period P may have an optimized dimension based on the incident light 2 with different wavelength, and is preferably between 200 nm and 3.6 um; the filling factor is preferably 0.5. The depth D may be determined based on the different structure of the multi-layer semiconductor structure layer 20. In certain embodiments, the depth D may be determined from a surface of the infrared detector structure to a bottom of the quantum well or the superlattice of the infrared detector structure. In certain embodiments, the depth D may be determined from a surface of the visible light detector structure or the ultraviolet light detector structure to a bottom of a depletion layer of the p-n junction or a bottom of an i-layer of the p-i-n junction of the visible light detector structure or the ultraviolet light detector structure. In certain embodiments, the depth D may be determined from a surface of the solar cell structure to a bottom of a depletion layer of the solar cell structure.

Figure 2:
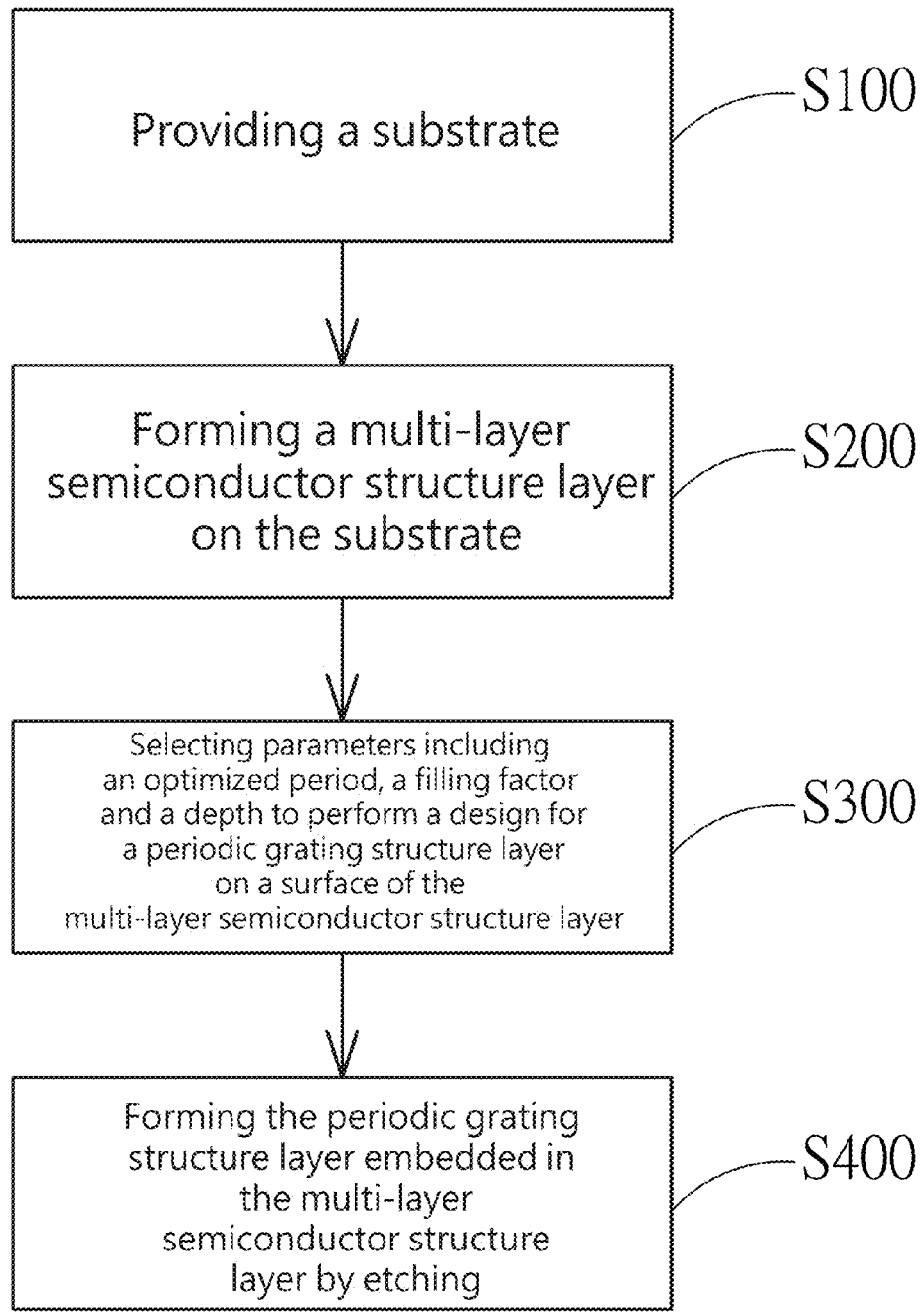
FIG. 2 is a flowchart of manufacturing an optoelectronic device having a surface periodic grating structure according to an embodiment of the present invention.

Referring to FIG. 2, which is a flowchart of manufacturing an optoelectronic device having a surface periodic grating structure according to an embodiment of the present invention. The method includes: (1) providing a substrate S100; (2) forming a multi-layer semiconductor structure layer on the substrate S200; (3) selecting parameters including an optimized period, a filling factor and a depth to perform a design for a periodic grating structure layer on a surface of the multi-layer semiconductor structure layer S300; and (4) forming the periodic grating structure layer embedded in the multi-layer semiconductor structure layer by etching S400. The substrate 10, the multi-layer semiconductor structure layer 20 and the periodic grating structure layer 30 form the optoelectronic apparatus 1. Implementation and description of the substrate 10, the multi-layer semiconductor structure layer 20 and the periodic grating structure layer 30 have been disclosed in the embodiment with reference to FIG. 1, and are not hereinafter repeated.

Figure 3:
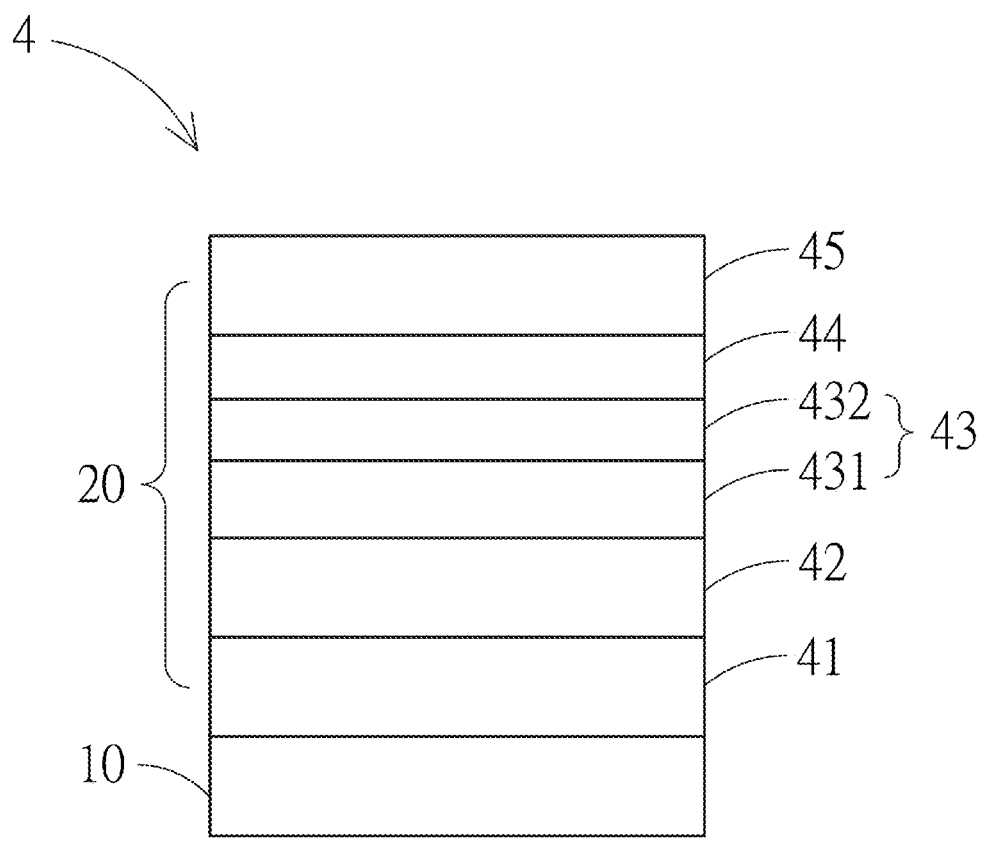
FIG. 3 is a structural view of a quantum well infrared detector according to an embodiment of the present invention.
Figure 4:
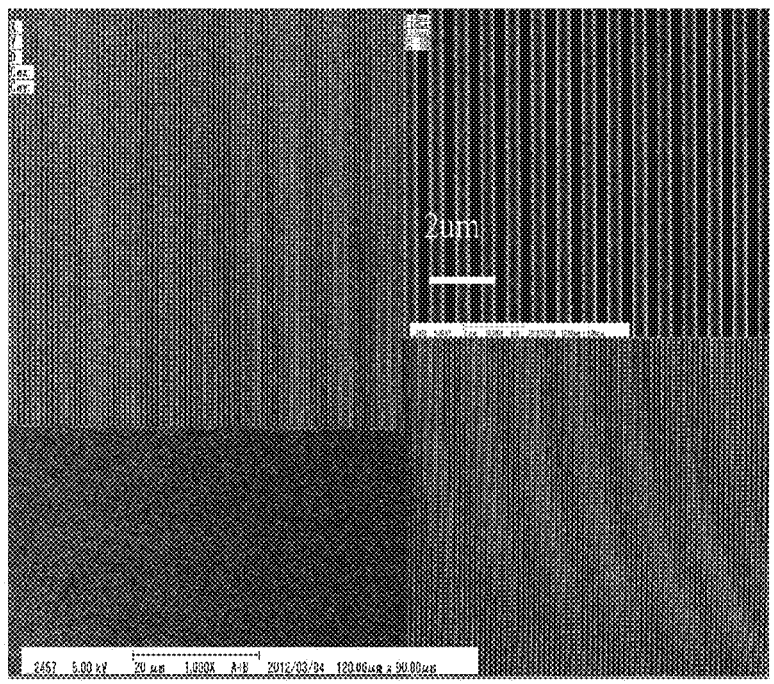
FIG. 4 is a scanning electron microscope (SEM) photo of a surface periodic grating structure according to an embodiment of the present invention, wherein the period is 800 nm and the filling factor is 0.5.
Figure 5:
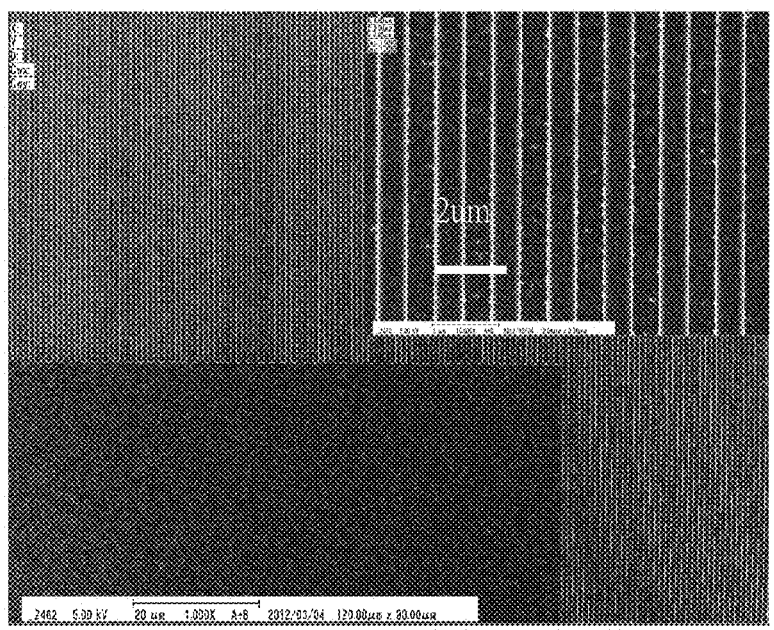
FIG. 5 is a SEM photo of a surface periodic grating structure according to an embodiment of the present invention, wherein the period is 1600 nm and the filling factor is 0.5.
Figure 6:
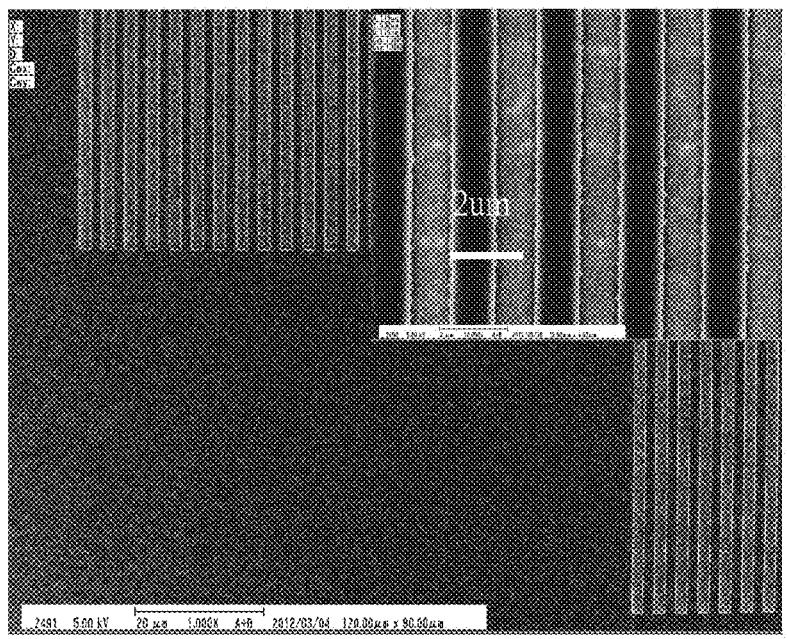
FIG. 6 is a SEM photo of a surface periodic grating structure according to an embodiment of the present invention, wherein the period is 2400 nm and the filling factor is 0.5.
Figure 7:
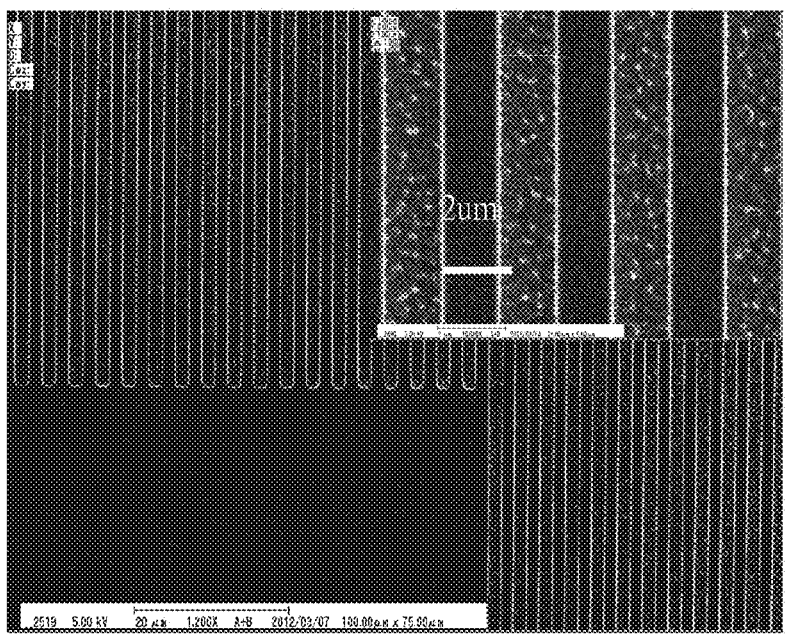
FIG. 7 is a SEM photo of a surface periodic grating structure according to an embodiment of the present invention, wherein the period is 3200 nm and the filling factor is 0.5.

Referring to FIG. 3, which is a structural view of a quantum well infrared detector according to an embodiment of the present invention, as well as FIG. 1. From bottom to top, the quantum well infrared detector 4 includes a substrate 10 made of GaAs, a non-doped GaAs buffer layer 41 having a thickness of 100 nm, a n-type doped GaAs bottom contact layer 42 having a thickness of 900 nm, a quantum well structure 43 formed with 20 pairs of an AlGaAs layer 431 having a thickness of 50 nm and a GaAs layer 432 having a thickness of 6 nm, an AlGaAs blocking layer 44 having a thickness of 50 nm, and a n-type doped GaAs top contact layer 45 having a thickness of 250 nm. The non-doped GaAs buffer layer 41, the n-type doped GaAs bottom contact layer 42, the quantum well structure 43 formed with the 20 pairs of the AlGaAs layer 431 and the GaAs layer 432, the AlGaAs blocking layer 44 and the n-type doped GaAs top contact layer 45 forms the multi-layer semiconductor structure layer 20. E-beam lithography technology is used to form four types of periodic gratings, each having a period of 800 nm, 1600 nm, 2400 nm and 3200 nm, on the surface of the quantum well infrared detector 4, and the filling factor is set as 0.5. Thus, each grating has a respective linewidth of 400 nm, 800 nm, 1200 nm and 1600 nm. Further, a dry etching system using inductively coupled plasma reactive ion etching (ICP-RIE) is applied to the four types of grating samples with different periods to perform etching, with each of the etching depth being 300 nm, 580 nm, 860 nm and 1420 nm, in order to form the periodic grating structure layer 30. The etching depth of 580 nm refers to etching to a quarter of the depth of the quantum well structure 43, the etching depth of 860 refers to etching to one half of the depth of the quantum well structure 43, and the etching depth of 1420 refers to etching to the bottom of the quantum well structure 43. Further, the typical photolithography manufacturing process is used to define a mesa of the quantum well infrared detector 4, followed by wet etching until the etching process reaches the n-type doped GaAs bottom contact layer 42. Finally, thermally evaporated deposition is used to deposit an upper electrode (not shown) and a bottom electrode (not shown) to complete the manufacturing process of the quantum well infrared detector. To obtain the characteristics of the quantum well infrared detector, a Fourier transform infrared spectroscopy (FTIS) system is used to perform measurement of photo and dark current and responsivity.

Referring to FIGS. 4-7, which respectively refer to a plurality of SEM photo of a surface periodic grating structure according to embodiments of the present invention. For each figure, the embedded small figure on the upper right corner is a partially enlarged view of the period grating structure. Each of the periods is 800 nm, 1600 nm, 2400 nm and 3200 nm, and for all figures, the filling factor is set at 0.5.

Figure 8:
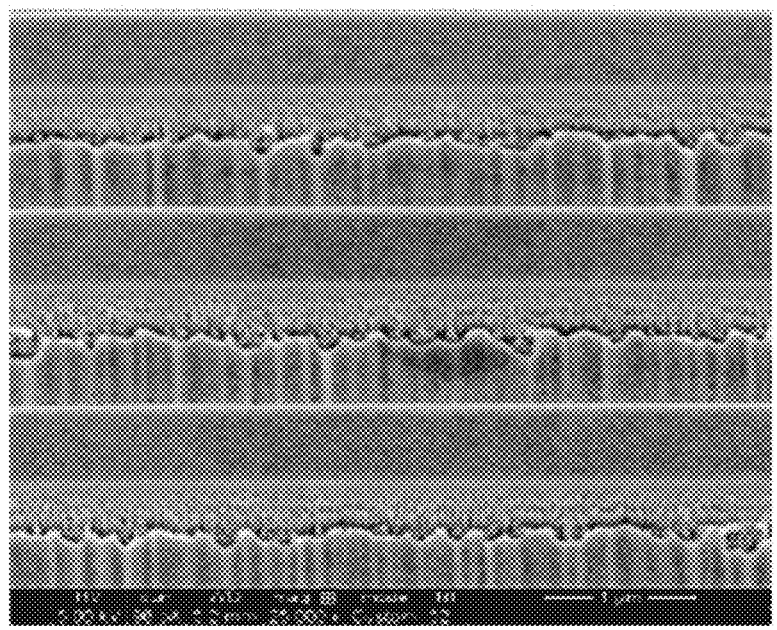
FIG. 8 is a SEM photo of a surface periodic grating structure with a tilt angle of 52 degrees according to an embodiment of the present invention, wherein the period is 1600 nm and the filling factor is 0.5.

Referring to FIG. 8, which is a SEM photo of a surface periodic grating structure with a tilt angle of 52 degrees according to an embodiment of the present invention. The period is 1600 nm and the filling factor is 0.5. As shown in FIG. 8, the depth of the periodic grating structure layer is about 580 nm.

Figure 9:
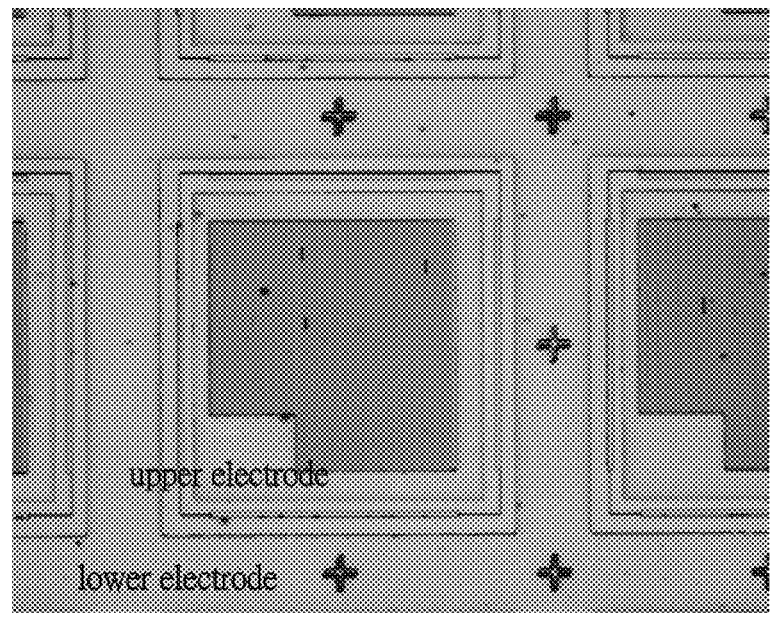
FIG. 9 is an optical microscope photo of a surface period grating structure according to an embodiment of the present invention.

Referring to FIG. 9, which is an optical microscope photo of a surface period grating structure according to an embodiment of the present invention. As shown in FIG. 9, the positions labeled as the upper electrode and the lower electrode refer to the contact points to apply voltages and receive output current for measuring the characteristics.

Figure 10:
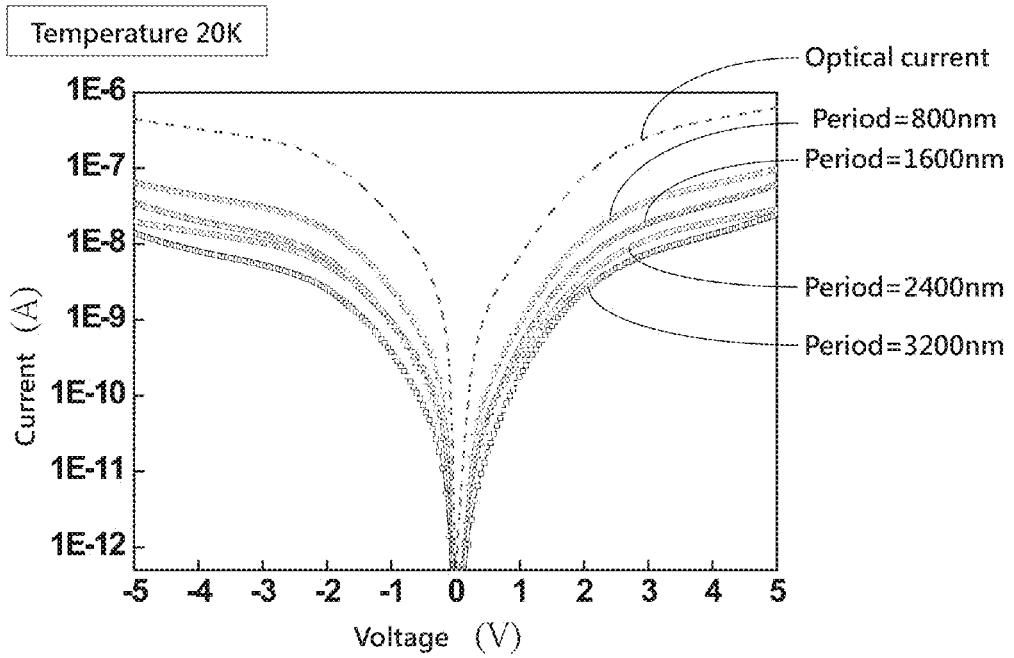
FIG. 10 is a diagram showing comparison of photo and dark current using surface period grating structures having different periods operative at a temperature of 20K according to an embodiment of the present invention.
Figure 11:
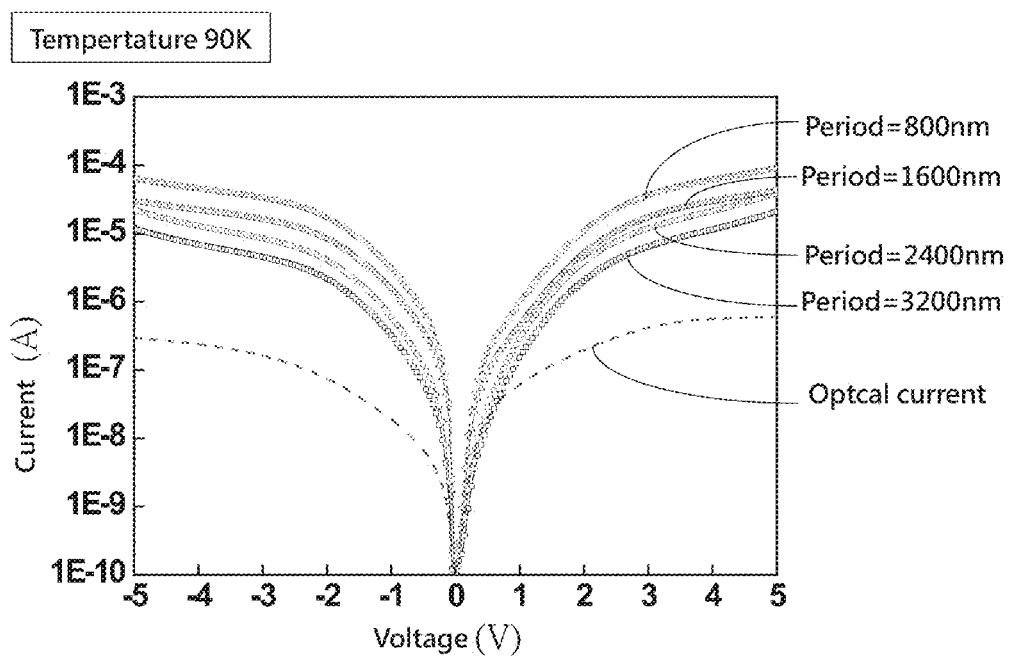
FIG. 11 is a diagram showing comparison of photo and dark current using surface period grating structures having different periods operative at a temperature of 90K according to an embodiment of the present invention.
Figure 12:
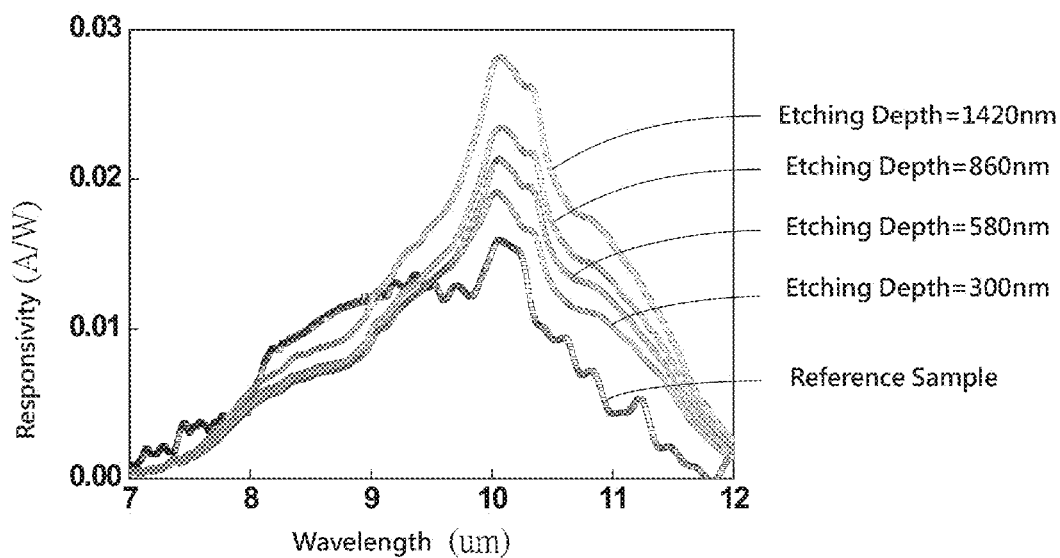
FIG. 12 is a curve diagram showing etching depth to responsivity of a surface period grating structure according to an embodiment of the present invention, wherein the period is 800 nm and the filling factor is 0.5.
Figure 13:
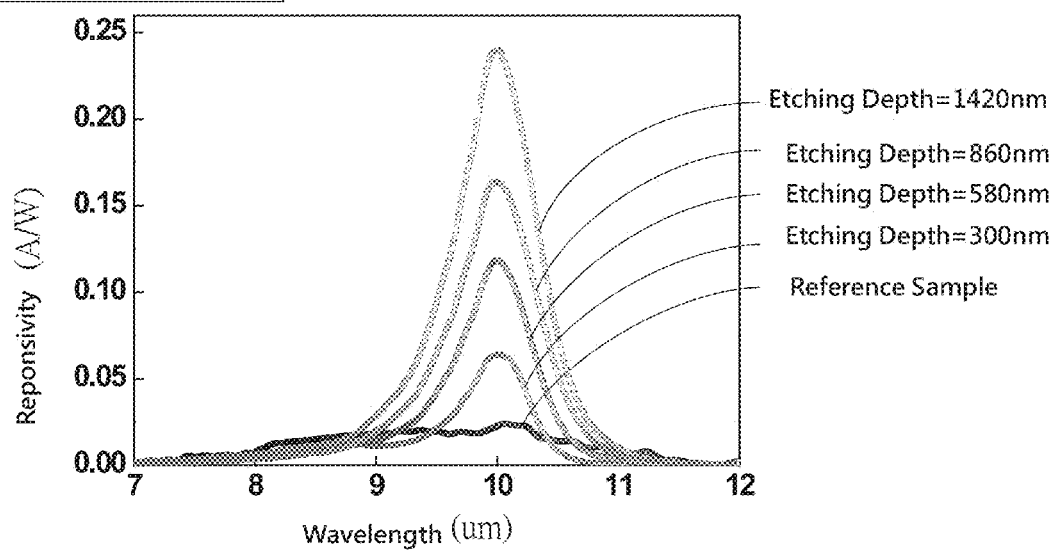
FIG. 13 is a curve diagram showing etching depth to responsivity of a surface period grating structure according to an embodiment of the present invention, wherein the period is 1600 nm and the filling factor is 0.5.
Figure 14:
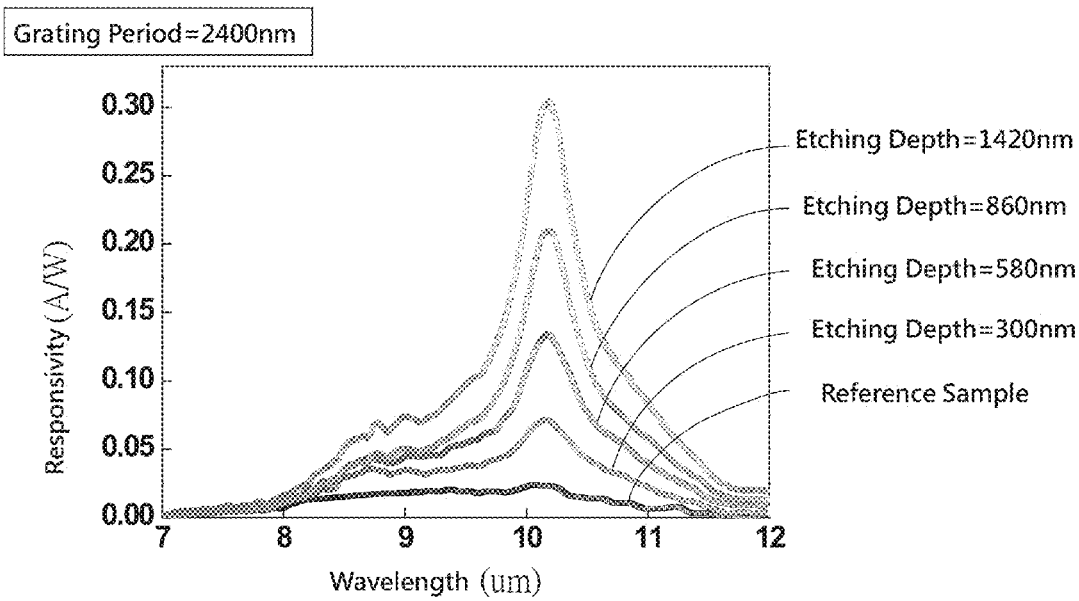
FIG. 14 is a curve diagram showing etching depth to responsivity of a surface period grating structure according to an embodiment of the present invention, wherein the period is 2400 nm and the filling factor is 0.5.
Figure 15:
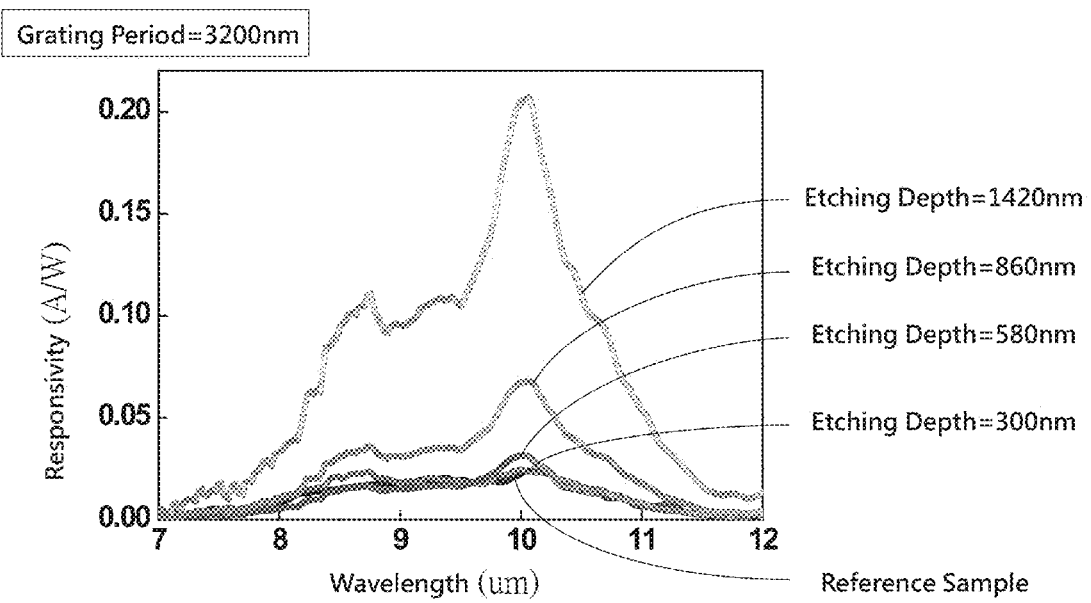
FIG. 15 is a curve diagram showing etching depth to responsivity of a surface period grating structure according to an embodiment of the present invention, wherein the period is 3200 nm and the filling factor is 0.5.

Referring to FIGS. 10 and 11, which show two diagrams showing comparison of optical dark current using surface period grating structures having different periods operative at a temperature of 20K and a temperature of 90K according to two embodiments of the present invention, as well as FIG. 3. The dark current of the quantum well infrared detector is an important indication of the characteristics. The power consumption problem may become serious if the dark current of the detector is too large, which may affect the operation of the read-out circuit. According to the diagrams, when the period P of the periodic grating structure layer 30 becomes longer, the dark current becomes smaller. This is due to the fact that, when the etching for the periodic grating structure layer 30 reaches the quantum well structure 43, i.e., the active region, the space of the active region of the quantum well structure 43 is reduced, which effectively reduces the dark current noise.

Referring to FIGS. 12-15, which respectively refer to a plurality of curve diagrams showing etching depth to responsivity of surface period grating structures according to embodiments of the present invention, as well as FIG. 3. Each of the periods is 800 nm, 1600 nm, 2400 nm and 3200 nm, and for all figures, the filling factor is set at 0.5. According to the curve diagrams, regardless of the period P of the surface periodic grating structure 30, when the etching depth of the periodic grating structure 30 becomes longer, i.e., deeper into the quantum well structure 43, the responsivity of the quantum well infrared detector becomes increased. This is due to the fact that the incident light 2 passes through the periodic grating structure 30 such that a direction of the incident light 2 is changed to become a horizontal light 3 parallel to the surface of the quantum well structure 43 and resonant to the quantum well structure 43, such that a transmitting path of the incident light 2 in the quantum well structure 43 is effectively extended without dispersion to the air, and the responsivity of the quantum well infrared detector is enhanced. On the other hand, when the etching depth of the periodic grating structure 30 is fixed, the responsivity becomes the largest when the periodic grating structure 30 has the period P of 2400 nm. Comparing to a quantum well infrared detector without the periodic grating structure 30, the responsivity may be increased by 13 times. It should also be appreciated that by etching the periodic grating structure 30 deep into the quantum well structure 43, the characteristics of the quantum well structure 43 has been changed, such that the shape of the curve diagrams as shown in FIGS. 12-15 are changed in response to the period P of the periodic grating structure 30.

According to the embodiments, when a periodic grating structure is formed on the quantum well infrared detector by etching the periodic grating structure into the quantum well structure 43, the dark current of the quantum well infrared detector may be significantly reduced, and the responsivity of the quantum well infrared detector may be increased.

The abovementioned embodiments are provided to illustrate the principles and exemplary methods of manufacturing or formation method of the present invention only. The scope of the present invention shall be defined by the claims recited hereafter, and any modifications or variations to the terms or wordings recited in the claims shall be considered as their relevant equivalence and are within the scope of the present invention. The scope of the present invention shall be determined by the content of the claims recited hereafter.

What is claimed is:

1. An optoelectronic device having a surface periodic grating structure, comprising:
    a substrate;
    a multi-layer semiconductor structure layer formed on the substrate; and
    a periodic grating structure layer embedded in the multi-layer semiconductor structure layer by etching, the periodic grating structure layer being performed with a design on a surface of the multi-layer semiconductor structure layer based on parameters including an optimized period between 200 nm and 3.6 um, a filling factor of 0.5 and a depth;
    wherein the substrate, the multi-layer semiconductor structure layer and the periodic grating structure layer form the optoelectronic device;
    wherein an incident light to the optoelectronic device is configured to pass through the periodic grating structure layer to enter the multi-layer semiconductor structure layer, and a direction of the incident light is changed to become a horizontal light parallel to the surface of the multi-layer semiconductor structure layer and resonant to the multi-layer semiconductor structure layer, such that a transmitting path of the incident light in the multi-layer semiconductor structure layer is extended to enhance optoelectricity of the optoelectronic device.

2. The optoelectronic device as claimed in claim 1, wherein the substrate is selected from a group consisting of Si, silicon on insulator (SOI), Ge, germanium on insulator (GeOI), GaAs, InP, InSb, CdTe, SiC, Al2O3, AlN, GaN, glass, quartz and a metal.

3. The optoelectronic device as claimed in claim 1, wherein the multi-layer semiconductor structure layer is selected from a group consisting of a group IV element semiconductor and alloy thereof, a group III-V compound and alloy thereof, a group II-VI compound and alloy thereof, and group IV-VI compound and alloy thereof.

4. The optoelectronic device as claimed in claim 3, wherein the multi-layer semiconductor structure layer comprises an infrared detector structure.

5. The optoelectronic device as claimed in claim 4, wherein the infrared detector structure is a quantum well infrared detector, a superlattice infrared detector, or a combination of the quantum well infrared detector and the superlattice infrared detector.

6. The optoelectronic device as claimed in claim 3, wherein the multi-layer semiconductor structure layer comprises at least one of a visible light detector structure or a ultraviolet light detector structure.

7. The optoelectronic device as claimed in claim 6, wherein the visible light detector structure or the ultraviolet light detector structure comprises at least one of a p-n junction or a p-i-n junction.

8. The optoelectronic device as claimed in claim 3, wherein the multi-layer semiconductor structure layer comprises a solar cell structure.

9. The optoelectronic device as claimed in claim 1, wherein a method of forming the multi-layer semiconductor structure layer on the substrate is one of molecular beam epitaxy (MBE) technology, metal-organic chemical vapor deposition (MOCVD) technology, and liquid phase epitaxy (LPE) technology.

10. The optoelectronic device as claimed in claim 1, wherein the periodic grating structure layer is one of a periodic column grating structure, a periodic gap grating structure, or a periodic column and gap grating structure.

11. The optoelectronic device as claimed in claim 10, wherein the periodic grating structure layer is arranged in one-dimension, two-dimension or three-dimension.

12. The optoelectronic device as claimed in claim 5, wherein the depth is determined from a surface of the infrared detector structure to a bottom of the quantum well or the superlattice of the infrared detector structure.

13. The optoelectronic device as claimed in claim 7, wherein the depth is determined from a surface of the visible light detector structure or the ultraviolet light detector structure to a bottom of a depletion layer of the p-n junction or a bottom of an i-layer of the p-i-n junction of the visible light detector structure or the ultraviolet light detector structure.

14. The optoelectronic device as claimed in claim 8, wherein the depth is determined from a surface of the solar cell structure to a bottom of a depletion layer of the solar cell structure.

15. The optoelectronic device as claimed in claim 1, wherein the design is performed by one of e-beam lithography technology or photolithography technology.

16. The optoelectronic device as claimed in claim 1, wherein the etching is performed by dry etching or wet etching.

17. The optoelectronic device as claimed in claim 1, wherein a waveband frequency spectrum of the incident light is between visible light and far infrared spectrum (300 nm~24 um).

* * * * *